(12) United States Patent
Andrieu et al.

(10) Patent No.: US 10,446,548 B2
(45) Date of Patent: Oct. 15, 2019

(54) INTEGRATED CIRCUIT INCLUDING BALANCED CELLS LIMITING AN ACTIVE AREA

(71) Applicants: Commissariat A L'Energie Atomique et aux Energies Alternatives, Paris (FR); STMICROELECTRONICS (CROLLES 2) SAS, Crolles (FR)

(72) Inventors: Francois Andrieu, Saint Ismier (FR); Remy Berthelon, Saint Martin d'Heres (FR)

(73) Assignees: Commissariat A L'Energie Atomique et aux Energies Alternatives, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 28 days.

(21) Appl. No.: 15/706,952

(22) Filed: Sep. 18, 2017

(65) Prior Publication Data

US 2018/0083006 A1    Mar. 22, 2018

(30) Foreign Application Priority Data

Sep. 19, 2016  (FR) .................................... 16 58733

(51) Int. Cl.
*H01L 27/092*     (2006.01)
*H01L 29/423*     (2006.01)
(Continued)

(52) U.S. Cl.
CPC .. *H01L 27/0922* (2013.01); *H01L 21/823807* (2013.01); *H01L 27/0207* (2013.01);
(Continued)

(58) Field of Classification Search
CPC ............. H01L 27/0922; H01L 27/1203; H01L 29/7848; H01L 29/4238; H01L 27/0207
See application file for complete search history.

(56) References Cited

U.S. PATENT DOCUMENTS

2005/0227440 A1* 10/2005 Ema ................ H01L 21/823857
438/275
2006/0237801 A1* 10/2006 Kavalieros ...... H01L 21/823807
257/388

(Continued)

OTHER PUBLICATIONS

French Preliminary Search Report dated May 30, 2017 in French Application 16 58733, filed on Sep. 19, 2016 ( with English Translation of Categories of Cited Documents & Written Opinion).

(Continued)

*Primary Examiner* — Nelson Garces
(74) *Attorney, Agent, or Firm* — Oblon, McClelland, Maier & Neustadt, L.L.P.

(57) ABSTRACT

An integrated circuit is provided, including: a first pair including a first nMOS transistor and a first pMOS transistor; a second pair including a second nMOS transistor and a second pMOS transistor; the first and the second nMOS transistors including a channel region made of silicon that is subjected to tensile stress, and their respective gates being positioned at least 250 nm from a border of their active zone; and a third pair including a third nMOS transistor having a same construction as the second nMOS transistor and a third pMOS transistor having a same construction as the first pMOS transistor and having a tensile stress that is lower by at least 250 MPa than the tensile stress of the channel region, respective gates of the transistors of the third pair being positioned at most 200 nm from a border of their active zone.

10 Claims, 4 Drawing Sheets

(51) Int. Cl.
*H01L 29/78* (2006.01)
*H01L 21/8238* (2006.01)
*H01L 27/12* (2006.01)
*H01L 29/10* (2006.01)
*H01L 27/02* (2006.01)

(52) U.S. Cl.
CPC ........ *H01L 27/092* (2013.01); *H01L 27/1203* (2013.01); *H01L 29/1054* (2013.01); *H01L 29/4238* (2013.01); *H01L 29/7848* (2013.01)

(56) References Cited

U.S. PATENT DOCUMENTS

| | | |
|---|---|---|
| 2007/0108526 A1 | 5/2007 | Kohyama |
| 2007/0202663 A1 | 8/2007 | Moroz et al. |
| 2010/0019317 A1 | 1/2010 | Moroz et al. |
| 2012/0049280 A1* | 3/2012 | Clifton ................ H01L 29/1054 257/347 |
| 2014/0008729 A1 | 1/2014 | Bedell et al. |
| 2014/0011328 A1 | 1/2014 | Bedell et al. |
| 2014/0183647 A1 | 7/2014 | Lu et al. |
| 2014/0312423 A1 | 10/2014 | Cheng et al. |
| 2015/0200205 A1 | 7/2015 | Cheng et al. |
| 2015/0356225 A1 | 12/2015 | Lu et al. |
| 2016/0020154 A1 | 1/2016 | Cheng et al. |

OTHER PUBLICATIONS

French Preliminary Search Report dated May 30, 2017 in French Application 16 58731, filed on Sep. 19, 2016 ( with English Translation of Categories of Cited Documents & Written Opinion).
R. A. Bianchi et al. "Accurate Modeling of Trench Isolation Induced Mechanical Stress effects on MOSFET electrical Performance" International Electron Devices Meeting, 2002, 4 pages.
Ke-Wei Su et al. "A Scaleable Model for STI Mechanical Stress Effect on Layout Dependence of MOS Electrical Characteristics", IEEE 2003 Custom Integrated Circuits Conference, 4 pages.
F. Sato et al. "Process and Local Layout Effect interaction on a high performance planar 20nm CMOS", 2013 Symposium on VLSI Technology Digest of Technical Papers, 2013, 2 pages.
Rimoon Agaiby et al. "Insight into the aggravated Lifetime Reliability in Advanced MOSFETs with Strained-Si Channels on SiGe Strain-Relaxed Buffers due to Self-Heating", IEEE Transactions on Electron Devices, vol. 55, No. 6, 2008, 6 pages.
G. Eneman et al. "Stress Simulations for Optimal Mobility Group IV p- and nMOS FinFETs for the 14 nm Node and Beyond", IEDM 2012, 4 page.

* cited by examiner

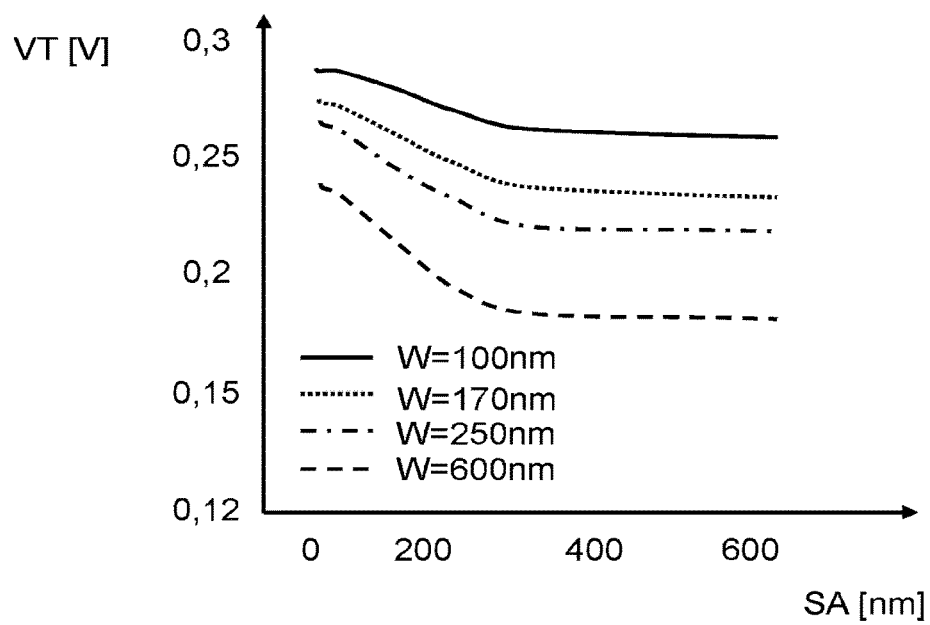
Fig. 3
Fig. 4
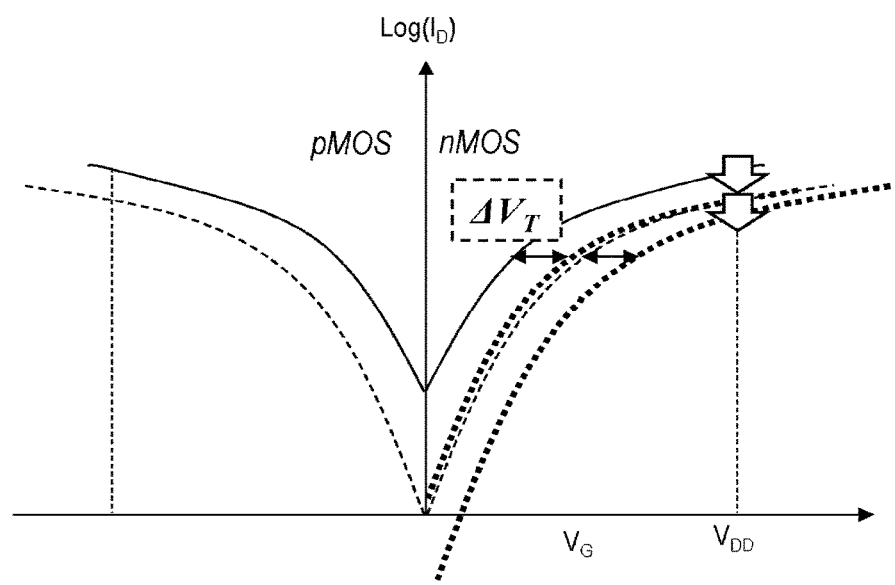

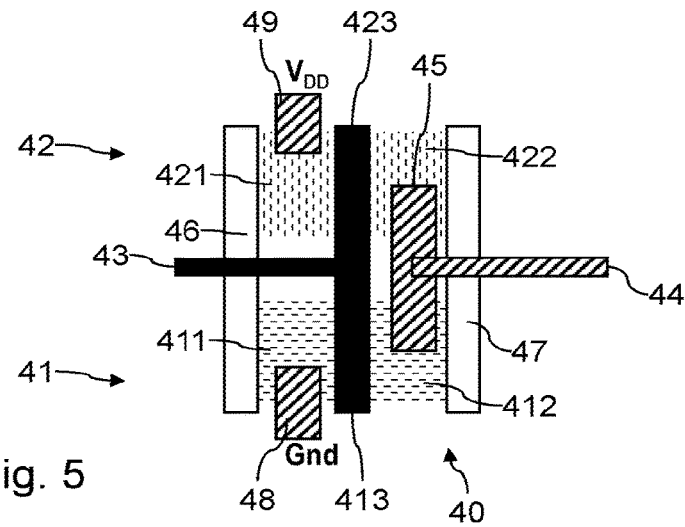
Fig. 5
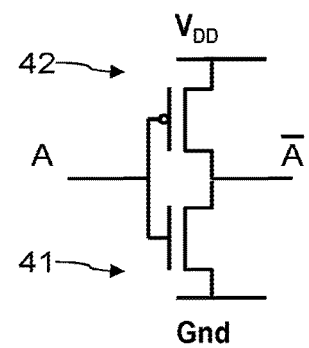
Fig. 6
Fig. 7
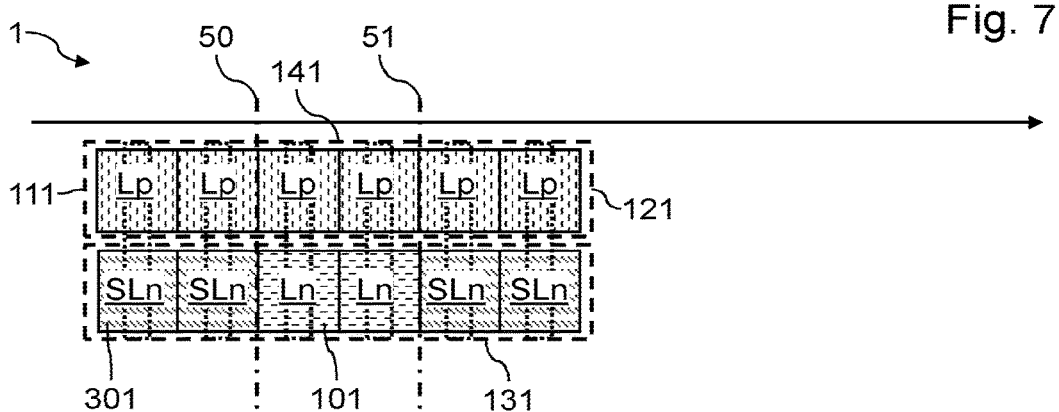
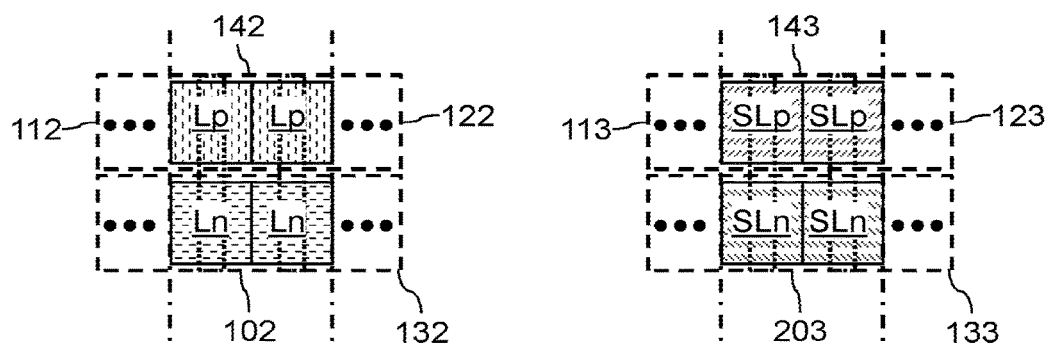

INTEGRATED CIRCUIT INCLUDING BALANCED CELLS LIMITING AN ACTIVE AREA

The invention relates to an integrated circuit, and in particular to an integrated circuit comprising cells including field-effect transistors with a channel subjected to tensile stress.

Many studies have focused on reducing the static consumption of logic gates while increasing their switching speed. Certain integrated circuits currently being developed incorporate both low-consumption logic gates and fast-access logic gates. To produce these two types of logic gate on one and the same integrated circuit, the threshold voltage of certain transistors is lowered to form fast-access logic gates or logic gates with a high on-state current, and the threshold voltage of other transistors is increased to form low-consumption logic gates.

It is thus typically possible to have super-low threshold voltage transistors, termed SLVT, low threshold voltage transistors, termed LVT, high threshold voltage transistors, termed HVT, and intermediate threshold voltage transistors, termed SVT or RVT. Typically, SLVT transistors have a threshold voltage of less than or equal to 300 mV, LVT transistors have a threshold voltage of less than or equal to 450 mV, HVT transistors of greater than or equal to 600 mV and RVT transistors of between 450 mV and 600 mV.

A logic gate generally combines a plurality of pairs of transistors to form a cell. Each pair comprises an nMOS transistor and a pMOS transistor of one and the same type, for example SLVT, LVT or RVT. It is important for the threshold voltage levels of the transistors of one and the same pair to be balanced in order that one of the transistors does not impair the performance of the pair of transistors or of the cell, for example its off-state leakage. FIG. 1 illustrates a gate voltage/drain current graph for two examples of pairs of transistors. The curve in an unbroken line corresponds to a balanced pair of nMOS/pMOS transistors of LVT type. The curve in a broken line corresponds to a balanced pair of nMOS/pMOS transistors of SLVT type.

In order to improve the performance of an nMOS transistor, it is known to form its active layer, including its channel zone, with silicon exhibiting a state of biaxial tensile stress, and in particular in its direction of transport. To achieve such a stress, the following method is used, for example.

We start from first and second silicon substrates. On the first substrate, an SiGe alloy is grown through epitaxy, with a gradual ramp of SiGe. An $Si_{1-x}Ge_x$ alloy is then grown through epitaxy. The $Si_{1-x}Ge_x$ alloy is then subjected to chemical-mechanical polishing. A layer of silicon is grown on the $Si_{1-x}Ge_x$ alloy through epitaxy. On account of the higher lattice parameter of the layer of $Si_{1-x}Ge_x$ alloy in comparison with the layer of silicon, this layer of silicon is subjected to biaxial tensile stress when it is grown through epitaxy. $SiO_2$ is deposited on the layer of silicon subjected to tensile stress. An implantation of hydrogen is then implanted into the layer of $Si_{1-x}Ge_x$ alloy.

On the second substrate, oxidation is carried out so as to form a layer of $SiO_2$ at the surface. The layer of $SiO_2$ of the first substrate is bonded to the layer of $SiO_2$ of the second substrate. The layer of $Si_{1-x}Ge_x$ alloy is cut out at the location of the hydrogen implantation, and then the first substrate is removed. The $Si_{1-x}Ge_x$ alloy is removed selectively with respect to the layer of silicon subjected to biaxial tensile stress. Such a configuration makes it possible to reduce the threshold voltage and to greatly boost the mobility of the carriers and to increase the current density in the on-state, this proving to be particularly advantageous for technological nodes of small size.

The channel of the nMOS transistor and the channel of the pMOS transistor moreover have concentrations of dopants that are generally identical for one and the same pair. Without the intentional addition of dopants into the channel of the transistors, the channel of the nMOS transistors and of the pMOS transistors is p-type, with a concentration of the order of $10^{15}$ dopants/cm$^3$. It is known that the addition of dopants into the channel of the transistors makes it possible to modify the threshold voltage of the transistors. For example, a p-type doping in the channel of the nMOS transistors will increase their threshold voltage. To transition from SLVT to LVT transistors, it is therefore possible to add n-doping for the pMOS transistors and p-doping for the nMOS transistors into the channel, with a close dopant concentration, so as to increase the threshold voltage of the two types of transistor.

Intentional stress is introduced into the channel of the transistors. One problem that arises, more particularly for technological nodes of small size, is that the distance decreases between the gate of the transistors and the border of the active silicon zone, in the direction of transport. Various active silicon zones are in particular delineated into islands by way of isolation trenches that are positioned in the rows of transistors. The nMOS transistors positioned in the proximity of the border of the active zone experience a relaxation of the tensile stress in their channel zone, for example during a step of etching the border of this active zone, before the trenches are filled with insulator. This relaxation may lead to the threshold voltage of such nMOS transistors increasing by up to 200 mV. An nMOS transistor of SLVT type may then have a threshold voltage corresponding to that of a transistor of LVT type. The cell or the corresponding pair of transistors including this nMOS transistor is then completely imbalanced, leading to significant performance losses in this cell.

FIG. 2 illustrates an example of threshold voltages for nMOS transistors of LVT and SLVT type as a function of their distance SA between their gate edge and the border of their active zone. The transistors are in this case of FDSOI type, with a buried oxide layer having a thickness of 10 nm, for an 18 nm technological node and a gate width of 200 nm. It is seen that increasing the threshold voltage for the nMOS transistors becomes truly significant for a value SA of less than 200 nm.

FIG. 3 illustrates the threshold voltages for various nMOS transistors as a function of their distance SA between their gate edge and the border of their active zone, for various gate width values, for a 14 nm technological node. It is seen here that increasing the threshold voltage for the nMOS transistors becomes truly significant for a value SA of less than 300 nm.

The voltage/current graph of FIG. 4 illustrates this threshold voltage shift for the nMOS transistors, the dotted curves corresponding to the specific case where the value SA is less than 200 nm, the other curves corresponding to the case of FIG. 1, with SA being at least equal to 500 nm.

The invention aims to overcome one or more of these drawbacks. The invention thus pertains to an integrated circuit, as defined in the appended claim 1.

The invention also pertains to the variants defined in the independent claims. Those skilled in the art will understand that each of the features of the following variants may be combined independently with the features of the independent claim, without actually constituting an intermediate generalization.

Other features and advantages of the invention will emerge clearly from the description thereof that is given hereinafter, by way of indication and without limitation, with reference to the appended drawings, in which:

FIG. 3 is a graph illustrating the threshold voltage of other nMOS transistors as a function of their distance from a border of their active silicon zone;

FIG. 4 is a current/voltage graph illustrating a threshold voltage shift for nMOS transistors that are close to the border of the active silicon zone;

FIG. 5 is a schematic plan view of an example of a cell forming an inverter;

FIG. 6 is an equivalent circuit diagram of the cell of FIG. 5;

FIG. 7 is a schematic plan view of an integrated circuit cointegrating various pairs of transistors, according to one embodiment of the invention;

Figure 1:
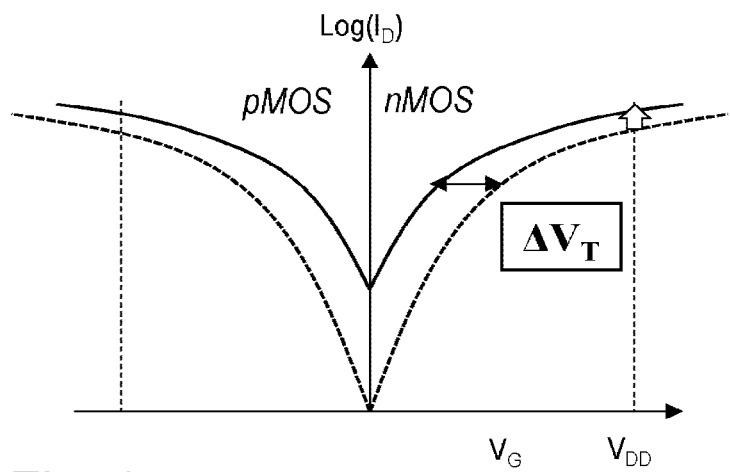
FIG. 1 is a current/voltage graph for examples of pairs of field-effect transistors.
Figure 2:
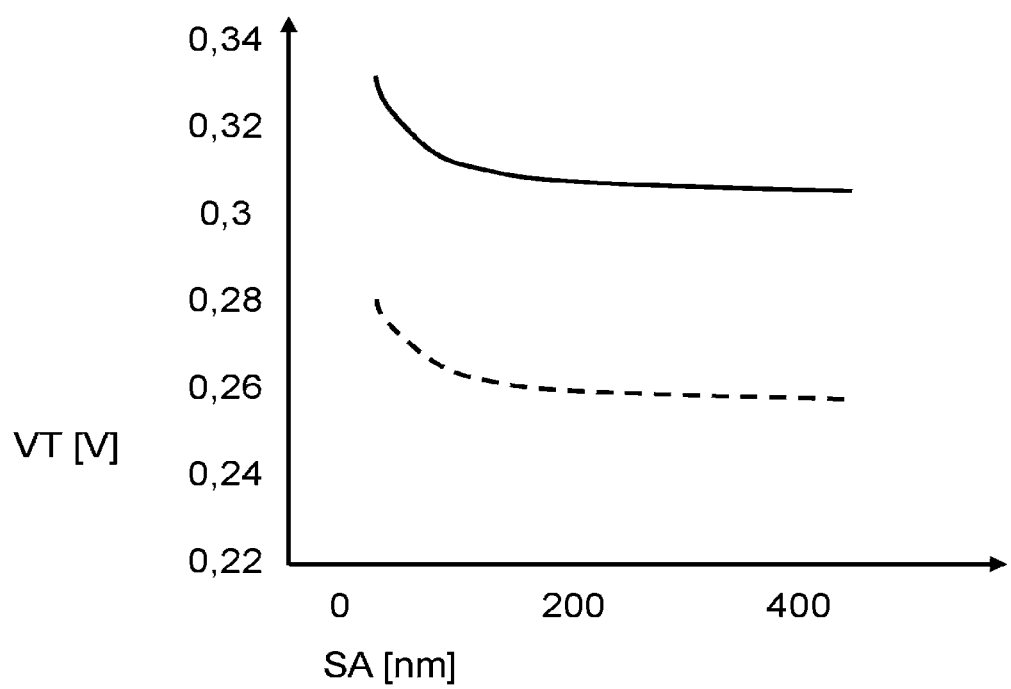
FIG. 2 is a graph illustrating the threshold voltage of various nMOS transistors as a function of their distance from a border of their active silicon zone.
Figure 8:
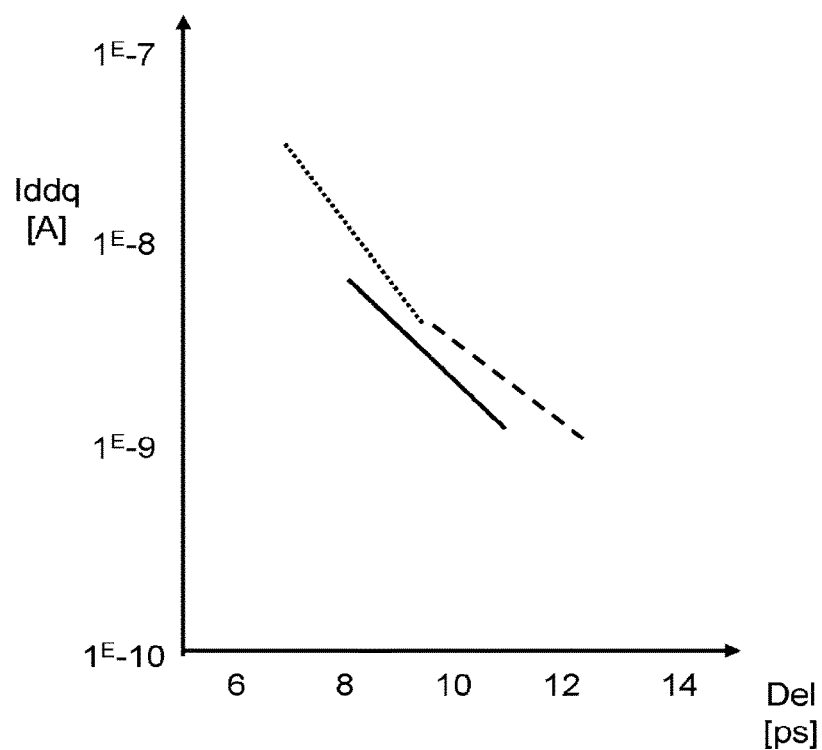
FIG. 8 is a comparative graph of the leakage currents/delays per stage for various inverter structures.

The invention proposes compensating for a loss of tensile stress in the direction of conduction, in a channel made of silicon initially subjected to biaxial tensile stress of an nMOS transistor, due to its proximity to a border of its active zone, by using the same nMOS transistor structure used for a lower threshold voltage level, in a zone at a greater distance from the border of this active zone.

FIG. 5 is a schematic view of an example of a cell 40 combining a pair formed of an nMOS transistor 41 and of a pMOS transistor 42. In this example of application, the cell 40 forms an inverter. In this example, the nMOS transistor 41 and the pMOS transistor 42 have a single gate finger. FIG. 6 is an equivalent circuit diagram of the cell 40. The nMOS transistor 41 includes a source 411, a drain 412 and a gate 413. The source 411 is connected to a ground potential Gnd by way of a contact 48. The pMOS transistor 42 includes a source 422, a drain 421 and a gate 423. The drain 421 is connected to a supply potential Vdd by way of a contact 49. An interconnection 45 electrically connects the drain 412 and the source 422. The gates 413 and 423 are interconnected. The cell 40 is isolated laterally in the direction of conduction by way of isolation trenches 46 and 47. The gates 413 and 423 are connected to an input terminal 43. The interconnection 45 is connected to an output terminal 44.

FIG. 7 is a schematic plan view of an integrated circuit 1 including a plurality of rows of pairs, each pair combining an nMOS transistor and a pMOS transistor. An active zone 131 includes a row of aligned nMOS transistors and an active zone 141 includes a row of aligned pMOS transistors, for one group of pairs. Another active zone 132 includes a row of aligned nMOS transistors and an active zone 142 includes a row of aligned pMOS transistors, for another group of pairs. Another active zone 133 includes a row of aligned nMOS transistors and an active zone 143 includes a row of aligned pMOS transistors, for another group of pairs.

The active semiconductor zone 131 has ends 111 and 121 along the direction of conduction of the transistors, illustrated by the horizontal arrow. The active semiconductor zone 132 has ends 112 and 122 along the direction of conduction of the transistors. The active semiconductor zone 133 has ends 113 and 123 along the direction of conduction of the transistors. The direction of conduction is defined by the direction going from the source to the drain of each of the transistors. The active zones 131, 132, 133, 141, 142 and 143 are delineated laterally by MESA etching (the principle of which is specifically described in document U.S. Pat. No. 3,894,895) or by deep isolation trenches.

Starting from the end 111 of the active zone 131, the integrated circuit 1 comprises a plurality of pairs 301 as far as the dot-and-dash line 50, which zone will be considered as being close to this end 111 of the active zone 131 (in this zone, the distance between the edge of the gates of the transistors and the end 111 is typically at most equal to 250 nm, or even preferably at most equal to 200 nm). Starting from the end 121 of the active zone 131, the integrated circuit 1 comprises a plurality of pairs 301 as far as the dot-and-dash line, which zone will be considered as being close to this end 121 of the active zone 131 (in this zone, the distance between the edge of the gates of the transistors and the end 121 is typically at most equal to 250 nm, or even preferably at most equal to 200 nm). Between the two dot-and-dash lines, the integrated circuit 1 comprises pairs 101, which zone will be considered as being remote from the ends 111 and 121 of the active zone 131 (in this zone, the distance between the edge of the gates of the transistors and the ends 111 and 121 is typically equal to at least 300 nm, or even preferably at least equal to 400 nm).

Each pair 101 includes an nMOS transistor denoted by the reference Ln and a pMOS transistor denoted by the reference Lp. The nMOS transistor Ln and the pMOS transistor Lp have one and the same threshold voltage level (the threshold voltage levels for the nMOS transistors and the pMOS transistors will be compared in terms of absolute value), of LVT type in the example.

Each pair 301 includes an nMOS transistor denoted by the reference SLn and a pMOS transistor denoted by the reference Lp. The structure or construction of a pMOS transistor Lp of a pair 301 is identical to that of the pMOS transistors Lp of the pairs 101. The structure or construction of an nMOS transistor SLn of a pair 301 is identical to that of the nMOS transistors SLn of the pairs 203 (described hereinafter). The structure of the various transistors and the motivation for such a configuration will now be described. The gates of the transistors of one or more pairs 101 may be interconnected, in a manner known per se, to form logic gates. The gates of the transistors of one or more pairs 301 may be interconnected.

The pairs of transistors 101 have their gate further from the ends 111 and 121 than the pairs of transistors 301.

Only the middle part of the active zone 142 has been illustrated. In its middle part, the integrated circuit 1 comprises a plurality of pairs 102 between the dot-and-dash lines, which zone will be considered as being remote from the ends 112 and 122 of the active zone 132 (in this zone, the distance between the edge of the gates of the transistors and the ends 112 and 122 is typically equal to at least 250 nm, or even preferably at least equal to 400 nm). Each pair 102 includes an nMOS transistor Ln and a pMOS transistor Lp, having the same construction as the transistors of a pair 101.

Only the middle part of the active zone 143 has been illustrated. In its middle part, the integrated circuit 1 comprises a plurality of pairs 203 between the dot-and-dash lines, which zone will be considered as being remote from the ends 113 and 123 of the active zone 133 (in this zone, the distance between the edge of the gates of the transistors and the ends 113 and 123 is typically equal to at least 250 nm, or even preferably at least equal to 400 nm). Each pair 203 includes an nMOS transistor denoted by the reference SLn and a pMOS transistor SLp. The transistors SLp have the same construction as the pMOS transistors of a pair 301. The nMOS transistor SLn and the pMOS transistor SLp of a pair 203 have one and the same threshold voltage level, of SLVT type in the example, that is lower in terms of absolute value than the threshold voltage level of the transistors Ln and Lp, respectively. The threshold voltage level of the transistors of the pairs 203 is lower than the threshold voltage level of the transistors of the pairs 102.

It will generally be considered that two transistors of the same type have one and the same structure or construction when their gates have the same dimensions, their gate metals (for example one and the same work function) and their gate insulators are identical, the doping of their channel is identical in terms of concentration and in terms of composition, they are implanted identically into their prospective well, and these prospective wells have one and the same bias, and when these transistors have identical geometry and dimensions.

The transistors Ln are for example nMOS transistors designed to have an LVT-type threshold voltage. The transistors SLn are for example nMOS transistors designed to have an SLVT-type threshold voltage. The structure of the nMOS transistors is known per se to those skilled in the art. The threshold voltage difference between the transistors Ln and the transistors SLn may for example be achieved by a difference in the doping of their channel. The channel of the nMOS transistors Ln is for example silicon doped with a p-type dopant, for example with a concentration of between $5*10^{12}$ cm$^{-3}$ and $5*10^{13}$ cm$^{-3}$. The p-type dopant is boron, for example. The channel of the nMOS transistors SLn is made of not intentionally doped silicon, for example (a few $10^{15}$ dopants/cm$^3$, for example).

The transistors Lp are for example pMOS transistors designed to have an LVT-type threshold voltage. The transistors SLp are for example pMOS transistors designed to have an SLVT-type threshold voltage. The channel of the transistors Lp may have one and the same concentration as the channel of the transistors Ln and one type of n-dopant, for example arsenic. The channel of the transistors SLp may be of the not intentionally doped type (a few $10^{15}$ dopants/cm$^3$, for example).

In a manner known per se, the channel of the transistors Ln and SLn is designed to exhibit a biaxial tensile pre-stress, and in particular in the direction of conduction. Such a tensile pre-stress is for example achieved by a method such as described in the introduction. The active zones are formed here on a buried insulating layer (for example a buried insulating layer of UTBOX (Ultra Thin Buried Oxide) type, typically having a thickness of at most 50 nm). The layer of silicon subjected to biaxial tensile pre-stress of the active zone 131, 132 or 133 typically has a thickness of between 5 and 15 nm.

Figure 9:
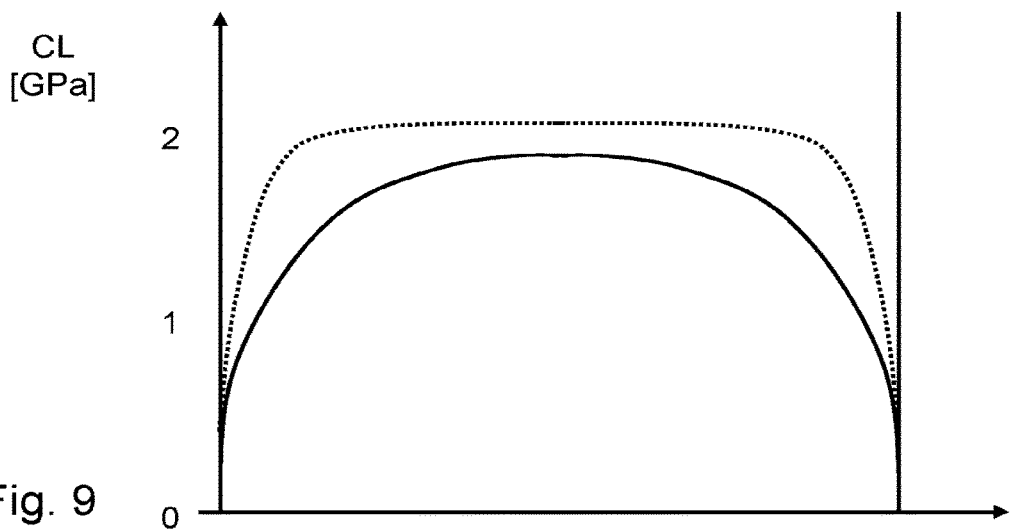
FIG. 9 illustrates graphs illustrating the tensile stress in the channel of the nMOS transistors as a function of their distance from the end of the active zone, for various active zone lengths.

When the borders of the active zones are delineated, the etching of the ends induces a relaxation of the silicon of the channel zones, leading to a reduction in its tensile stress in the direction of conduction, in the pairs 301. The reduction in the tensile stress of the silicon of the channel zone in the pairs 301 is all the greater when the pair 301 is close to the end 111 or 121. FIG. 9 illustrates the tensile stress in the silicon of the channel zone of the nMOS transistors as a function of the relative position of the edge of their gate with respect to the ends of the active zone 131. The curve in an unbroken line corresponds to an active zone 131 with a length of 520 nm. The curve in a broken line corresponds to an active zone 131 with a length of 1960 nm.

The reduction in the tensile stress in the direction of conduction in the silicon of the channel zone of the nMOS transistors of the pairs 301 is in this case at least equal to 250 MPa with respect to the tensile stress in the silicon of the channel zone of the nMOS transistors of the pairs 101, or even at least equal to 700 MPa, or even greater than 900 MPa, on account of the relaxation in the proximity of the ends 111 and 121. Such a reduction in the tensile stress in the nMOS transistors of the pairs 301 therefore has a tendency to increase their threshold voltage.

The threshold voltage difference between the transistors SLn of the pairs 203 and the transistors SLn of the pairs 301 means that the threshold voltage of the transistors Ln of the pairs 101 is roughly equivalent to that of the transistors SLn of the pairs 301, and therefore has a level that is close or identical to that of the transistors Lp of the pairs 301. The pairs 301 are therefore balanced by incorporating thereinto transistors SLn in a structure identical to that of transistors SLp that are used elsewhere in the integrated circuit 1 (for example in the pairs 203), thereby making it possible to balance the pairs 301 without having to manufacture specific transistors, and therefore without having to use additional etching masks or manufacturing steps.

In the preceding example, the threshold voltage difference between the transistors Ln and the transistors SLn of the pairs 101 or 102 and 203 is based on a difference in the concentration of dopants in their respective channels. It is possible for example to envision that the transistors Ln have a concentration of p-type dopants in their channel that is at least two times greater than that of the channel of the transistors SLn.

It is also possible to envision that the threshold voltage difference between the transistors Ln and the transistors SLn of the pairs 101 or 102 and 203 is based on a difference in the work function of their gate materials, or possibly on the type of doping of the wells arranged underneath these transistors, or on a difference in the bias of these wells.

It is also possible to envision that the threshold voltage difference between the transistors Ln and the transistors SLn of the pairs 101 or 102 and 203 is based on a gate length difference of 10 to 15 nm.

A change of n-type transistor at the active zone border proves beneficial as soon as the threshold voltage shift induced by the relaxation of the channel in the proximity of the border of the channel is significant with respect to the difference between two threshold voltage levels. For example, if the difference between a transistor of LVt construction and a transistor of SLVt construction is denoted by GVt, if the threshold voltage variation induced by the proximity of the active zone border is denoted by EVt, it will be considered that it is necessary to change the transistor as soon as Evt≥GVt/2. Sens denotes, for example, the sensitivity of the threshold voltage of an nMOS transistor to the biaxial tensile stress in its channel. It is possible to determine the variation in stress VCcri starting from which a change of nMOS transistor is preferable using the following relationship:

$$VCcri=GVt/(2*Sens)$$

It may be assumed that the stress in the channel in the proximity of the active zone border varies with the distance in accordance with an exponential law, as follows:

$\sigma(d)=\sigma max*(1-e^{-(d/Li)})$, where $\sigma max$ is the maximum biaxial stress in the channel of the nMOS transistors of the row, and Li is the distance between the gate and the active zone border starting from which the influence of the border on the stress of the channel becomes non-negligible.

The distance Dlim for which it may prove beneficial to change the construction of the n-type transistors is defined for example by the following relationship:

$$Dlim=-Li*\ln(GVT/(2*Sens*\sigma max))$$

This distance Dlim typically makes it possible to determine the number of pairs to be included in the zones at the active zone border.

The invention applies to transistors in different designs, for example bulk substrate or SOI, with a biased or unbiased well, with or without doping of the well.

The invention may apply for example to planar transistors or to FinFET-type transistors.

The invention has been described with reference to transistors of LVT and SLVT type, but may of course apply to transistors having other threshold voltage levels.

The invention claimed is:

1. An integrated circuit, comprising:
   a first transistor pair including a first nMOS transistor and a first pMOS transistor, the first nMOS transistor being disposed in and on an active silicon zone, the first nMOS transistor including a source, a drain, and a channel region made of silicon that is subjected to tensile stress in a direction from the source to the drain, the first nMOS transistor and the first pMOS transistor having a same first absolute threshold voltage;
   a second transistor pair including a second nMOS transistor and a second pMOS transistor, the second nMOS transistor being disposed in and on an active silicon zone, the second nMOS transistor including a source, a drain, and a channel region that is subjected to tensile stress in the direction, the second nMOS transistor and the second pMOS transistor having a same second absolute threshold voltage, the second absolute threshold voltage being lower than the first absolute threshold voltage; and
   a third transistor pair including a third nMOS transistor having a same construction as the second nMOS transistor and having an absolute threshold voltage equal to the first absolute threshold voltage, the third transistor pair including a third pMOS transistor having a same construction as the first pMOS transistor and an absolute threshold voltage equal to the first absolute threshold voltage, the third nMOS transistor being disposed in and on an active silicon zone, a channel region of the third nMOS transistor having a tensile stress in the direction that is lower than that of the channel region of the first nMOS transistor, a gate of the third nMOS transistor being disposed at a distance from a border of its active zone in the direction that is smaller than a distance between a gate of the first nMOS transistor and a border of its active zone.

2. The integrated circuit according to claim 1, wherein the gate of the third nMOS transistor is disposed at a distance at most equal to 200 nm from the border of its active zone in the direction.

3. The integrated circuit according to claim 1, wherein the gates of the first and the second nMOS transistors are disposed at a distance at least equal to 250 nm from the borders of their respective active zones in the direction.

4. The integrated circuit according to claim 1, wherein the active silicon zones are formed on a buried insulating layer.

5. The integrated circuit according to claim 4, wherein the buried insulating layer has a thickness at most equal to 50 nm.

6. The integrated circuit according to claim 1, wherein the channel region of the second nMOS transistor and a channel region of the second pMOS transistor of the second pair are of the not intentionally doped type.

7. The integrated circuit according to claim 1, wherein dopants in the channel region of the first nMOS transistor and in a channel region of the first pMOS transistor of the first pair are of opposite type and a concentration of the dopants is identical.

8. The integrated circuit according to claim 1, wherein the first nMOS transistor and the second nMOS transistor differ through at least one of the following parameters:
   a concentration of dopant in the channel region of the first nMOS transistor and in a channel region of the first pMOS transistor,
   a work function of a gate material of the first nMOS transistor and of the first pMOS transistor,
   a type of doping of a well disposed underneath the first nMOS transistor and the second nMOS transistor, and
   a bias of the well disposed underneath the first nMOS transistor and the second nMOS transistor.

9. An integrated circuit, comprising:
   a first transistor pair including a first nMOS transistor and a first pMOS transistor, the first nMOS transistor being disposed in and on an active silicon zone, the first nMOS transistor including a source, a drain, and a channel region made of silicon that is subjected to tensile stress in a direction from the source to the drain, the first nMOS transistor and the first pMOS transistor having a same absolute threshold voltage level;
   a second transistor pair including a second nMOS transistor and a second pMOS transistor, the second nMOS transistor being disposed in and on an active silicon zone, the second nMOS transistor including a source, a drain, and a channel region that is subjected to tensile stress in the direction, the second nMOS transistor and the second pMOS transistor having a same absolute threshold voltage level and being lower than the threshold voltage level of the first nMOS transistor and of the first pMOS transistor; and
   a third transistor pair including a third nMOS transistor having a same construction as the second nMOS transistor and a third pMOS transistor having a same construction as the first pMOS transistor, the third nMOS transistor being disposed in and on an active silicon zone, a channel region of the third nMOS transistor having a tensile stress in the direction that is lower than that of the channel region of the first nMOS transistor, a gate of the third nMOS transistor being disposed at a distance from a border of its active zone in the direction that is smaller than a distance between a gate of the first nMOS transistor and a border of its active zone,
   wherein the gate of the third nMOS transistor and a gate of the third pMOS transistor of the third pair are coupled.

10. The integrated circuit according to claim 1, wherein the channel region of the third nMOS transistor has a tensile stress in the direction that is lower by at least 250 MPa than the tensile stress of the channel region of the first nMOS transistor.

* * * * *